United States Patent
Paryani et al.

(10) Patent No.: US 8,004,243 B2
(45) Date of Patent: Aug. 23, 2011

(54) BATTERY CAPACITY ESTIMATING METHOD AND APPARATUS

(75) Inventors: Anil Paryani, Cerritos, CA (US); Scott Ira Kohn, Redwood City, CA (US); Brian Boggs, Menlo Park, CA (US); Andrew David Baglino, San Francisco, CA (US); Craig Bruce Carlson, Los Altos, CA (US)

(73) Assignee: Tesla Motors, Inc., Palo Alto, CA (US)

( * ) Notice: Subject to any disclaimer, the term of this patent is extended or adjusted under 35 U.S.C. 154(b) by 338 days.

(21) Appl. No.: 12/384,696

(22) Filed: Apr. 8, 2009

(65) Prior Publication Data
US 2010/0138178 A1    Jun. 3, 2010

(51) Int. Cl.
*H02J 7/00* (2006.01)
*G01N 27/416* (2006.01)
(52) U.S. Cl. .................. 320/132; 324/427; 324/429
(58) Field of Classification Search .............. 702/63; 429/92, 90; 320/136; 324/425, 426, 427, 324/428, 429, 430, 431, 432, 433, 434
See application file for complete search history.

(56) References Cited

U.S. PATENT DOCUMENTS

| | | | | |
|---|---|---|---|---|
| 5,658,682 | A * | 8/1997 | Usuda et al. | 429/92 |
| 7,557,584 | B2 * | 7/2009 | Murakami et al. | 324/429 |
| 2008/0094035 | A1 * | 4/2008 | Plett | 320/136 |

* cited by examiner

*Primary Examiner* — Mohamed Charioui
*Assistant Examiner* — Manuel Rivera Vargas
(74) *Attorney, Agent, or Firm* — Patent Law Office of David G. Beck

(57) ABSTRACT

A method for accurately estimating battery capacity based on a weighting function is provided. The disclosed system monitors battery current and uses the monitored battery current to calculate the state of charge (SOCbyAh) of the battery. The system also measures the open circuit voltage (OCV) of the battery when the system is at rest, rest being determined by achieving a current of less than a preset current value for a period of time greater than a preset time period. The state of charge of the battery is calculated from the OCV (SOCbyOCV). The weighting function is based on $\Delta$SOCbyAh and $\Delta$SOCbyOCV, where $\Delta$SOCbyAh is equal to SOCbyAh$_{First\ time}$ minus SOCbyAh$_{Second\ time}$, and where $\Delta$SOCbyOCV is equal to SOCbyOCV$_{First\ time}$ minus SOCbyOCV$_{Second\ time}$. The weighting function also takes into account the errors associated with determining SOCbyAh and SOCbyOCV.

19 Claims, 3 Drawing Sheets

US 8,004,243 B2

BATTERY CAPACITY ESTIMATING METHOD AND APPARATUS

FIELD OF THE INVENTION

The present invention relates generally to battery cells and, more particularly, to a method and apparatus for estimating battery capacity.

BACKGROUND OF THE INVENTION

In battery-powered systems, the ability to accurately estimate the charge remaining in the battery is highly desirable, and in many cases essential. For example, in portable electronic devices such as cameras, cell phones, portable gaming systems and computers, knowing such information allows the end user to gauge how much longer they can use the device before recharging becomes necessary. In some cases, this information can prevent the end user from inadvertently losing data, a common occurrence when a camera or a computer suddenly stops functioning due to the battery becoming fully discharged. In other applications, such as electric vehicles, knowing the remaining battery capacity may make the difference between a successful trip and an unsuccessful trip, i.e., one in which the vehicle and its driver become stranded when, without providing sufficient warning, the battery becomes fully discharged. Additionally, since a battery's voltage drops as the state of charge of the battery is reduced, knowing the state of charge allows an accurate estimate to be made of the power available to the battery-operated device, e.g., an electric vehicle.

In order to accurately estimate the remaining capacity of a battery, it is critical that the full capacity of the battery be accurately known. Unfortunately, under normal use conditions such as those encountered in an electric vehicle or other battery-power device, it is difficult to accurately ascertain battery capacity. For example, in one method of determining battery capacity, the initial capacity of the battery is gradually decreased based on a variety of factors such as battery age, the number of charge/discharge cycles to date, and temperature. Unfortunately this technique does not provide a very accurate assessment of battery capacity, both because some factors are not properly taken into account (e.g., historical temperature profiles, load conditions, depth of discharge prior to each charging, charge/discharge rates, etc.) and because the effects of the errors accumulate as the battery ages. Another method of determining battery capacity is to allow the battery to become fully discharged, and then determine the capacity of the battery during charging. Although this technique can be used occasionally, using it on a routine basis can have serious repercussions since deep discharging a battery, and in particular fully discharging a battery, can dramatically shorten its lifetime. Additionally, for most battery-powered devices, especially electric vehicles, it would be extremely inconvenient to require that the user allow the battery to become fully discharged prior to charging. This would be similar to requiring that a conventional car be driven until the gas tank was dry before refilling, simply in order to determine the gas tank's capacity.

Accordingly, what is needed is a method of accurately estimating battery capacity that is less susceptible to, or more accurately takes into account, the many factors that can influence a battery's capacity. The present invention provides such an estimation method and apparatus for implementing the same.

SUMMARY OF THE INVENTION

The present invention provides a method and apparatus for accurately estimating battery capacity based on a weighting function. The disclosed system monitors battery current and uses the monitored battery current to calculate the state of charge (SOCbyAh) of the battery. The system also measures the open circuit voltage (OCV) of the battery when the system is at rest, rest being determined by achieving a current of less than a preset current value for a period of time greater than a preset time period. The state of charge of the battery is calculated from the OCV (SOCbyOCV). The weighting function is based on $\Delta$SOCbyAh and $\Delta$SOCbyOCV, where $\Delta$SOCbyAh is equal to SOCbyAh$_{First\ time}$ minus SOCbyAh$_{Second\ time}$, and where $\Delta$SOCbyOCV is equal to SOCbyOCV$_{First\ time}$ minus SOCbyOCV$_{Second\ time}$. The weighting function also takes into account the errors associated with determining $\Delta$SOCbyAh and $\Delta$SOCbyOCV.

A further understanding of the nature and advantages of the present invention may be realized by reference to the remaining portions of the specification and the drawings.

DESCRIPTION OF THE SPECIFIC EMBODIMENTS

In the following text, the terms "battery", "cell", and "battery cell" may be used interchangeably and may refer to any of a variety of different rechargeable cell chemistries and configurations including, but not limited to, lithium ion (e.g., lithium iron phosphate, lithium cobalt oxide, other lithium metal oxides, etc.), lithium ion polymer, nickel metal hydride, nickel cadmium, nickel hydrogen, nickel zinc, silver zinc, or other battery type/configuration. Additionally, the accompanying figures are only meant to illustrate, not limit, the scope of the invention.

Figure 1:
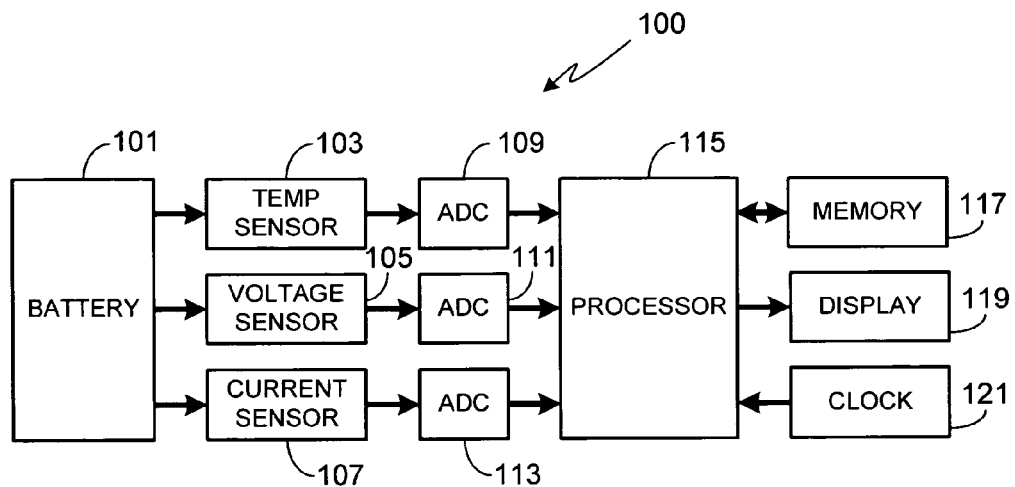
FIG. 1 illustrates a block diagram of the primary subsystems and components involved in a preferred embodiment of the invention.

FIG. 1 is a block diagram of the primary subsystems and components involved in a preferred embodiment of the invention for use in an electric vehicle (EV), hybrid electric vehicle (HEV), plug-in hybrid electric vehicle (PHEV), laptop computer, cellular phone, or other application utilizing a battery power source. It will be appreciated that other system configurations can be utilized while still retaining the functionality of the present invention. Additionally, it should be understood that one or more of the elements shown in FIG. 1 can be grouped together in a single device, and/or circuit board, and/or integrated circuit.

As shown, system 100 includes a battery 101. Battery 101 may be comprised of a single cell, or a plurality of electrically interconnected cells configured to achieve the desired voltage and capacity for the intended application. Coupled to battery 101 is a temperature sensor 103. Sensor 103 can use any of a variety of temperature sensing elements, e.g., thermocouples, thermistors, resistance temperature detectors (RTDs), etc. Although FIG. 1 only shows a single representative sensor 103, it should be understood that multiple sensors 103 may be used to give an average temperature, especially in the case of a battery 101 comprised of a large plurality of cells, i.e., a battery pack. Also coupled to battery 101 is a voltage sensor 105 and a current sensor 107, sensors 105 and 107 measuring the voltage and current, respectively, of the battery. As required, the output from sensors 103, 105 and 107 are converted into digital signals with analog-to-digital converters (ADC) 109, 111 and 113, respectively, before being input into processor 115. Coupled to processor 115 is storage memory 117 and a display 119. Memory 117 is comprised of non-volatile memory, for example EPROM, EEPROM, flash memory, RAM, or other memory device. Display 119 is used to display the results of the SOC estimation system or other data. Preferably display 119 is comprised of a visual display, although other types of user communication devices/systems can be used, e.g., an audio-based system. Internal to, or coupled to, processor 115 is a clock 121.

Figure 2:
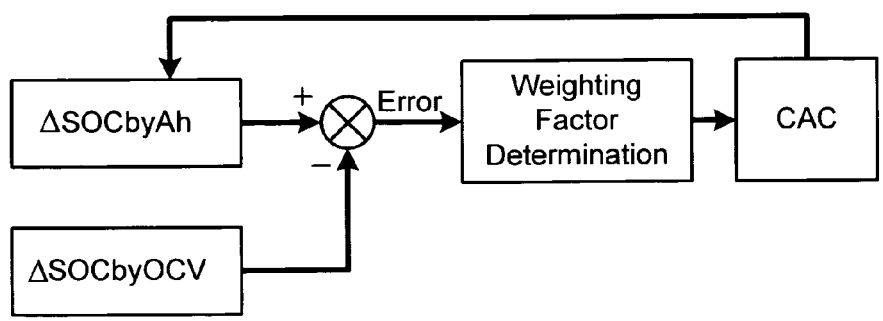
FIG. 2 illustrates the basic control loop implemented by the invention.
Figure 3:
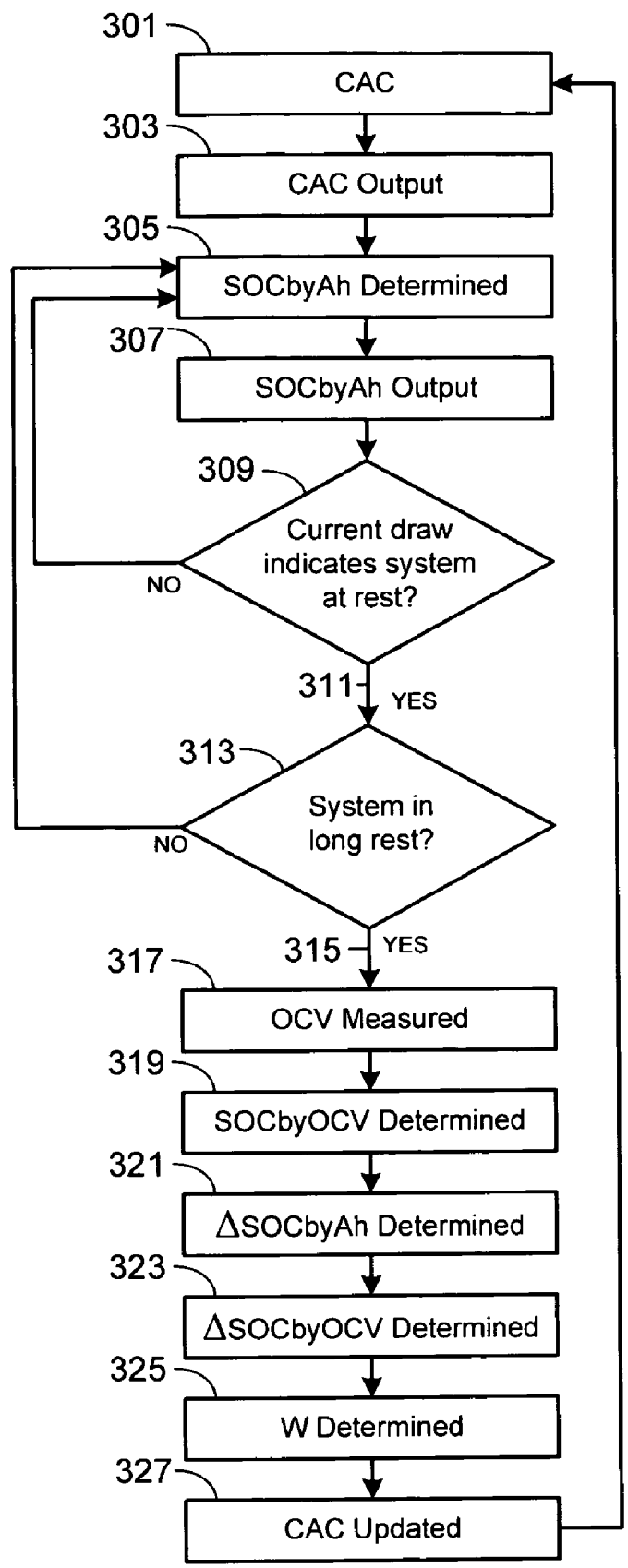
FIG. 3 is a flowchart that illustrates the battery capacity estimating method of the present invention.

FIG. 2 illustrates the control loop of the invention while FIG. 3 is a flowchart of the methodology utilizing the illustrated control loop. Initially, the battery capacity as last determined is entered (step 301), the battery capacity referred to herein as the computed amp-hour capacity (CAC) and the last determined CAC of the battery referred to herein as $CAC_{Prior}$. The CAC is output to the system (step 303) for use in calculating the remaining battery capacity, and thus the remaining amp-hours, available for use by the device. Next, the state of charge (SOC) of the battery is calculated, referred to herein as the SOCbyAh, this calculation based on the last computed CAC and the amp-hours used since the battery was last charged (step 305). In general, in order to calculate the amp-hours used (Ah_used), the battery current is monitored using current sensor 107 and integrated over time. Accordingly and as used herein, the battery current integrated over a first time period is referred to as $Ah\_used_{First\ time}$ while the battery current integrated over a second time period is referred to as $Ah\_used_{Second\ time}$. This calculation is performed at a relatively high frequency in order to insure up-to-date information is used by the system in calculating remaining amp hours, for example, at 10 Hz or higher in automotive applications, and every 1 to 10 seconds in other, less dynamic, applications. The SOCbyAh may be calculated using the formula:

$$SOCbyAh=1-(Ah\_used/CAC)$$

In addition to using SOCbyAh in the calculation of CAC as shown below, preferably this value is output to the system as well (step 307), e.g., for use in determining the remaining available amp-hours.

In accordance with the invention, in addition to calculating the SOCbyAh, the system also calculates the SOCbyOCV, where OCV refers to open circuit voltage. As the SOCbyOCV must be determined when battery 101 is in equilibrium, the system monitors the battery current using current sensor 107 to determine when the system has entered a period of rest, represented by the system drawing minimal current (step 309). It will be appreciated that the threshold for defining minimal current draw will vary with the type of system. For example, in some portable electronic devices, this threshold will be set very close to 0 amps while in other systems in which background systems are continually operating, e.g., electric vehicles, the threshold may be set at a much higher value, for example 2 amps.

Once the load on the battery drops below the threshold (step 311), in step 313 the system determines if sufficient time has passed to reach equilibrium, this time referred to herein as a system 'rest' period. This step insures that the value obtained for SOC is valid. As the length of time required to reach equilibrium varies with battery polarization, a look-up table or model-based calculation may be used in this step. The look-up table provides the required rest period as a function of battery temperature. After the system determines that the load on the battery is below the threshold value (step 311) and that the system has entered into a rest period (step 315), then the system measures the system's open circuit voltage (OCV) using voltage monitor 105 (step 317). Next, the system determines the SOCbyOCV using a look-up table that provides SOC as a function of voltage (step 319).

During the next process steps, values for ΔSOCbyAh (step 321) and ΔSOCbyOCV (step 323) are calculated using the formulae:

$$\Delta SOCbyAh=SOCbyAh_{First\ time}-SOCbyAh_{Second\ time}$$

$$\Delta SOCbyOCV=SOCbyOCV_{First\ time}-SOCbyOCV_{Second\ time}$$

Note that the 'first' and 'second' readings for SOCbyAh and SOCbyOCV refer to the same instances in time, i.e., both the $SOCbyAh_{First\ time}$ and $SOCbyOCV_{First\ time}$ are determined at a first specific time and both the $SOCbyAh_{Second\ time}$ and $SOCbyOCV_{Second\ time}$ are determined at a second specific time. It should be further noted that although these calculations can be performed at any time as long as the system has entered into a rest period, preferably a preset minimum amount of time has passed between the 'first' and 'second' SOC readings. This preset time may be based on actual time (e.g., greater than 10 minutes for temperatures greater than 25° C.), based on the number of cycles between operational and rest modes (e.g., at least 1 cycle), or based on some combination of the two (e.g., greater than 60 minutes during a long rest period and greater than 10 minutes after the system has undergone a complete cycle). In a preferred embodiment, the calculations of this control loop are performed whenever SOCbyOCV is updated, unless the measured voltage is less than some preset minimum, e.g., 3.0 volts.

Figure 4:
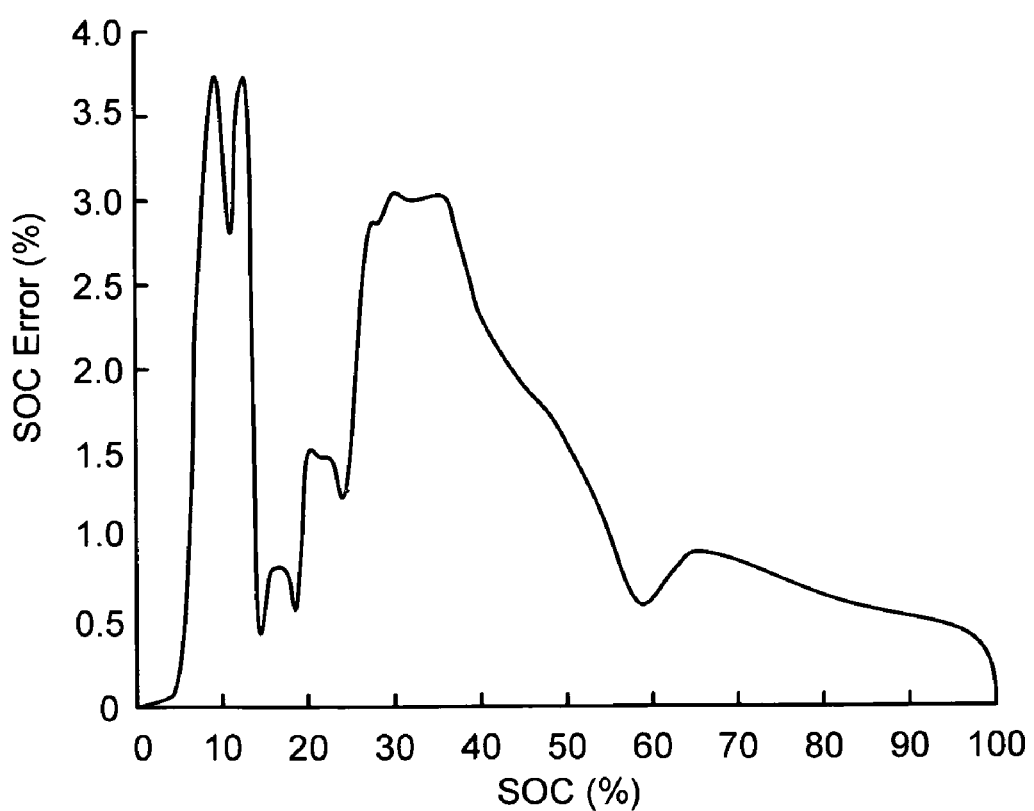
FIG. 4 illustrates the variation in SOCbyOCV error as a function of SOC.

According to the invention, the ΔSOCbyAh is compared to the ΔSOCbyOCV and if the calculated error (see FIG. 2) is negative, then the CAC is downwardly adjusted, while if the calculated error is positive, then the CAC is upwardly adjusted. This adjustment is made by multiplying the current CAC by a weighting function, W, where W is given by:

$$W = 100 - \left(k1 * \frac{100 * SOCbyAhError}{\Delta SOCbyAh} + k2 * \frac{100 * SOCbyOCVError}{\Delta SOCbyOCV} + k3 * SOCbyOCVErrorPrev\right)$$

where $$SOCbyAh\text{Error}=\int(g \times iBat+k)dt,$$

and where g is the gain error, iBat is the battery current, and k is the current offset error. The term SOCbyOCVError is calculated using the measurement error in the battery. For example, FIG. 4 shows the SOC error as a function of SOC for a particular case. In addition to open circuit voltage, the SOCbyOCVError is dependent on rest time and temperature since the colder a battery becomes, the longer it takes to depolarize. Accordingly, SOCbyOCVError must take into account the temperature of the battery. For example, a cell's open circuit voltage may take four hours to fully relax at temperatures less than 0° C., while only taking 10 minutes at 30° C. Therefore, if the temperature is cold and the rest time is short, the SOCbyOCVError should be high.

The term SOCbyOCVErrorPrev, used in the weighting calculation, is the SOCbyOCVError determined for the previous weighting calculation. This term is included to account for the situation in which the earlier 'rest' occurs in an inaccurate part of the OCV/SOC curve (for example, at less than 55% SOC for LiCoO2 cells) while the later 'rest' occurs in an accurate part of the OCV/SOC curve, thus insuring that the errors are not weighted high as the ΔSOCbyOCV is not accurate.

Constants k1, k2 and k3 in the weighting calculation are based on sensor accuracies and control loop timing. These constants, like many non-linear real-world systems, are difficult to model and therefore are generally tuned based on real-world experimental data, the intended use of the device, and how much overshoot and response time can be tolerated. Typically, the initial settings for the constants are based on sensor accuracy and usage assumptions. For instance, in an EV application where the consequences of overshoot are severe and there are frequent rests (e.g., when the driver stops at the grocery store, school, restaurant, etc.), these constants are set high to give a low weighting. In contrast, in a laptop computer where the consequences are less severe and the rests are infrequent, these constants may be given lower values, thereby giving high weighting and higher gain in the control loop. In a preferred embodiment for an EV application, k1 is equal to 4, k2 is equal to 3, and k3 is equal to 8.

Once the weighting function, W, is calculated (step 325), the CAC is updated (i.e., the $CAC_{Updated}$) by multiplying the previously determined CAC (i.e., the $CAC_{Prior}$) by the weighting function (step 327). Accordingly, $$CAC_{Updated} = (W)(CAC_{Prior}).$$

As will be understood by those familiar with the art, the present invention may be embodied in other specific forms without departing from the spirit or essential characteristics thereof.

What is claimed is:

1. A method for estimating battery capacity of a battery, the method comprising the steps of:
   reading $CAC_{Prior}$, wherein $CAC_{Prior}$ is the last determined computed amp-hour capacity of the battery;
   monitoring battery current of the battery using a current sensor;
   determining $SOCbyAh_{First\ time}$ at a first time, wherein $SOCbyAh_{First\ time}$ is the state of charge of the battery calculated by amp-hours at said first time;
   determining $SOCbyOCV_{First\ time}$ at said first time, wherein $SOCbyOCV_{First\ time}$ is the state of charge of the battery calculated from the battery open circuit voltage (OCV) at said first time;
   determining $SOCbyAh_{Second\ time}$ at a second time, wherein $SOCbyAh_{Second\ time}$ is the state of charge of the battery calculated by amp-hours at said second time;
   determining $SOCbyOCV_{Second\ time}$ at said second time, wherein $SOCbyOCV_{Second\ time}$ is the state of charge of the battery calculated from the battery OCV at said second time;
   calculating ΔSOCbyAh, wherein $$\Delta SOCbyAh = SOCbyAh_{First\ time} - SOCbyAh_{Second\ time}$$

calculating ΔSOCbyOCV, wherein $$\Delta SOCbyOCV = SOCbyOCV_{First\ time} - SOCbyOCV_{Second\ time};$$

calculating a weighting function, W, defined as $$W = 100 - \left( k1 * \frac{100 * SOCbyAhError}{\Delta SOCbyAh} + k2 * \frac{100 * SOCbyOCVError}{\Delta SOCbyOCV} + k3 * SOCbyOCVErrorPrev \right)$$

wherein SOCbyAhError is the error associated with determining SOCbyAh, SOCbyOCVError is the error associated with determining SOCbyOCV, SOCbyOCVErrorPrev is the previously determined error associated with SOCbyOCV, and k1, k2 and k3 are constants; and
   calculating $CAC_{Updated}$, wherein said $CAC_{Updated} = (W)(CAC_{Prior})$.

2. The method of claim 1, wherein said step of determining $SOCbyAh_{First\ time}$ is calculated in accordance with the formula:

$$SOCbyAh_{First\ time} = 1 - (Ah\_used_{First\ time} / CAC_{Prior});$$

wherein said step of determining $SOCbyAh_{Second\ time}$ is calculated in accordance with the formula:

$$SOCbyAh_{Second\ time} = 1 - (Ah\_used_{Second\ time} / CAC_{Prior}).$$

3. The method of claim 2, further comprising the steps of:
   monitoring battery current;
   integrating battery current over a first time period to determine $Ah\_used_{First\ time}$, wherein said first time period is defined as the time between the last battery charge and said first time; and
   integrating battery current over a second time period to determine $Ah\_used_{Second\ time}$, wherein said second time period is defined as the time between the last battery charge and said second time.

4. The method of claim 1, further comprising the steps of monitoring battery current and comparing said battery current to a preset current value, wherein said battery current is less than said preset current value prior to performing said step of determining $SOCbyOCV_{First\ time}$, and wherein said battery current is less than said preset current value prior to performing said step of determining $SOCbyOCV_{Second\ time}$.

5. The method of claim 1, further comprising the steps of monitoring battery current and comparing said battery current to a preset current value, wherein said battery current is less than said preset current value for a period of time greater than a preset time period prior to performing said step of determining $SOCbyOCV_{First\ time}$, and wherein said battery current is less than said preset current value for a period of time greater than said preset time period prior to performing said step of determining $SOCbyOCV_{Second\ time}$.

6. The method of claim 1, wherein said $SOCbyOCV_{First\ time}$ determining step further comprises the steps of measuring the battery OCV at said first time and retrieving said $SOCbyOCV_{First\ time}$ from a look-up table, wherein said look-up table provides SOC as a function of battery OCV, and wherein said $SOCbyOCV_{Second\ time}$ determining step further comprises the steps of measuring the battery OCV at said second time and retrieving said $SOCbyOCV_{Second\ time}$ from said look-up table.

7. The method of claim 1, further comprising the step of calculating SOCbyAhError in accordance with the formula:

$$SOCbyAhError = \int (g \times iBat + k) dt,$$

wherein g is gain error, iBat is battery current, and k is current offset error.

8. The method of claim 1, further comprising the step of retrieving SOCbyOCVError from a look-up table, wherein said look-up table provides SOCbyOCVError as a function of SOC.

9. The method of claim 1, further comprising the step of setting $CAC_{Prior}$ to $CAC_{Updated}$, wherein said $CAC_{Prior}$ setting step is performed after said $CAC_{Updated}$ calculating step.

10. The method of claim 9, further comprising the step of repeatedly calculating $CAC_{Updated}$ for subsequent times.

11. The method of claim 1, wherein said determining and calculating steps are performed by an electrical circuit.

12. A method for estimating battery capacity of a battery, the method comprising the steps of:
- monitoring battery current of the battery using a current sensor;
- calculating Ah_used from said battery current, wherein Ah_used corresponds to the amp-hours used;
- calculating SOCbyAh from said Ah_used, wherein SOCbyAh is the state of charge of the battery calculated using said Ah_used;
- comparing said battery current to a preset current value;
- measuring the open circuit voltage (OCV) of the battery when said battery current is less than said preset current value for a period of time greater than a preset time period;
- determining SOCbyOCV from said measured OCV, wherein SOCbyOCV is the state of charge of the battery calculated from the OCV;
- calculating $\Delta SOCbyAh$, wherein $$\Delta SOCbyAh = SOCbyAh_{First\ time} - SOCbyAh_{Second\ time},$$

wherein said first time and said second time correspond to two separate times when said battery current was less than said preset current value for a period of time greater than said preset time period;

calculating $\Delta SOCbyOCV$, wherein $$\Delta SOCbyOCV = SOCbyOCV_{First\ time} - SOCbyOCV_{Second\ time};$$

calculating a weighting function, W, defined as $$W = 100 - \left(k1 * \frac{100 * SOCbyAhError}{\Delta SOCbyAh} + k2 * \frac{100 * SOCbyOCVError}{\Delta SOCbyOCV} + k3 * SOCbyOCVErrorPrev\right)$$

wherein SOCbyAhError is the error associated with determining SOCbyAh, SOCbyOCVError is the error associated with determining SOCbyOCV, SOCbyOCVErrorPrev is the previously determined error associated with SOCbyOCV, and k1, k2 and k3 are constants; and calculating an updated computed amp-hour capacity, $CAC_{Updated}$, from a previously calculated computed amp-hour capacity, $CAC_{Prior}$, wherein $$CAC_{Updated} = (W)(CAC_{Prior}).$$

13. The method of claim 12, wherein said step of calculating SOCbyAh is calculated in accordance with the formula:

$$SOCbyAh = 1 - (Ah\_used/CAC_{Prior}).$$

14. The method of claim 12, wherein said SOCbyOCV determining step further comprises the step of retrieving said SOCbyOCV from a look-up table, wherein said look-up table provides SOC as a function of battery OCV.

15. The method of claim 12, further comprising the step of calculating SOCbyAhError in accordance with the formula:

$$SOCbyAhError = \int (g \times iBat + k) dt,$$

wherein g is gain error, iBat is battery current, and k is current offset error.

16. The method of claim 12, further comprising the step of retrieving SOCbyOCVError from a look-up table, wherein said look-up table provides SOCbyOCVError as a function of SOC.

17. The method of claim 12, further comprising the step of retrieving SOCbyOCVError from a look-up table, wherein said look-up table provides SOCbyOCVError as a function of temperature.

18. The method of claim 12, further comprising the step of repeatedly calculating $CAC_{Updated}$ for subsequent times.

19. The method of claim 12, wherein said monitoring, calculating, comparing and determining steps are performed by an electrical circuit.

* * * * *